United States Patent
Nishimura et al.

(10) Patent No.: US 8,154,171 B2
(45) Date of Patent: Apr. 10, 2012

(54) BOUNDARY ACOUSTIC WAVE DEVICE

(75) Inventors: Kazunori Nishimura, Kyoto (JP);
Hiroyuki Nakamura, Osaka (JP);
Hidekazu Nakanishi, Osaka (JP);
Ryouichi Takayama, Osaka (JP);
Takashi Inoue, Osaka (JP)

(73) Assignee: Panasonic Corporation, Osaka (JP)

( * ) Notice: Subject to any disclaimer, the term of this patent is extended or adjusted under 35 U.S.C. 154(b) by 118 days.

(21) Appl. No.: 12/680,774

(22) PCT Filed: Oct. 21, 2008

(86) PCT No.: PCT/JP2008/002976
§ 371 (c)(1),
(2), (4) Date: Mar. 30, 2010

(87) PCT Pub. No.: WO2009/054121
PCT Pub. Date: Apr. 30, 2009

(65) Prior Publication Data
US 2010/0219718 A1 Sep. 2, 2010

(30) Foreign Application Priority Data
Oct. 23, 2007 (JP) .................................. 2007-274972

(51) Int. Cl.
*H03H 9/25* (2006.01)
(52) U.S. Cl. .................................................. 310/313 R
(58) Field of Classification Search .............. 310/313 R, 310/340, 313 B, 320
See application file for complete search history.

(56) References Cited

U.S. PATENT DOCUMENTS

| | | | | |
|---|---|---|---|---|
| 7,224,101 B2* | 5/2007 | Mishima et al. | .......... | 310/313 A |
| 7,471,027 B2* | 12/2008 | Kando | .......... | 310/313 A |
| 7,564,174 B2* | 7/2009 | Matsuda et al. | .......... | 310/346 |
| 7,589,452 B2* | 9/2009 | Hauser et al. | .......... | 310/313 R |
| 7,863,801 B2* | 1/2011 | Kadota | .......... | 310/313 A |
| 7,915,786 B2* | 3/2011 | Matsuda et al. | .......... | 310/313 A |

(Continued)

FOREIGN PATENT DOCUMENTS

JP 3-46232 U 4/1991

(Continued)

OTHER PUBLICATIONS

International Search Report for PCT/JP2008/002976, Jan. 13, 2009.

*Primary Examiner* — Thomas Dougherty
(74) *Attorney, Agent, or Firm* — RatnerPrestia

(57) ABSTRACT

A boundary acoustic wave device includes a first medium layer made of piezoelectric material, a second medium layer provided on the first medium layer, a third medium layer provided on the second medium layer, and an electrode provided at an interface between the second and third medium layers. The electrode drives the third medium layer to generate a transverse wave. A propagation speed of the transverse wave in the third medium layer is lower than a propagation speed of the transverse wave in the first medium layer. A propagation speed of the transverse wave in the second medium layer is lower than the propagation speed of the transverse wave in the first medium layer. This boundary acoustic wave device has a large electro-mechanical coupling coefficient.

20 Claims, 3 Drawing Sheets

U.S. PATENT DOCUMENTS

| | | | |
|---|---|---|---|
| 7,977,848 B2 * | 7/2011 | Warashina et al. | 310/313 R |
| 7,982,365 B2 * | 7/2011 | Goto et al. | 310/313 R |
| 8,049,395 B2 * | 11/2011 | Kando | 310/313 R |
| 2006/0138902 A1 | 6/2006 | Kando | |
| 2008/0061657 A1 | 3/2008 | Matsuda et al. | |
| 2009/0066189 A1 * | 3/2009 | Kando | 310/346 |
| 2009/0295508 A1 * | 12/2009 | Isobe et al. | 333/195 |

FOREIGN PATENT DOCUMENTS

| | | |
|---|---|---|
| JP | 10-335974 A | 12/1998 |
| JP | 2008-67289 A | 3/2008 |
| WO | WO 98/52279 A1 | 11/1998 |
| WO | WO 2004/095699 A1 | 11/2004 |
| WO | WO 2005/069486 A1 | 7/2005 |

* cited by examiner

BOUNDARY ACOUSTIC WAVE DEVICE

This application is a U.S. National Stage Application of the PCT International Application No. PCT/JP2008/002976.

TECHNICAL FIELD

This invention relates to a boundary acoustic wave device for use in, for example, a mobile telephone.

BACKGROUND ART

FIG. 4 is a cross-sectional view of conventional boundary acoustic wave device 501 described in Patent Document 1. This device includes medium layer 1 made of LiNbO$_3$, medium layer 2 made of SiO$_2$ stacked on medium layer 1, and interdigital transducer (IDT) electrode 3 made of Au formed at interface 501A between medium layers 1 and 2. In boundary acoustic wave device 501, an SH type boundary acoustic wave as a main mode propagates along interface 501A between medium layers 1 and 2.

The boundary acoustic wave propagates and displaces medium layers 1 and 2. In boundary acoustic wave device 501, an area in which medium layer 2 made of SiO2 is displaced is larger than an area in which medium layer 1 made of LiNbO$_3$ is displaced. This structure prevents the boundary acoustic wave from concentrating at interface 501A, and accordingly, prevents the device from exhibiting superior piezoelectric characteristics of LiNbO$_3$ of medium layer 1, i.e., prevents the device from having a large electro-mechanical coupling coefficient.

Patent Document 1: WO 2004/095699

SUMMARY OF THE INVENTION

A boundary acoustic wave device includes a first medium layer made of piezoelectric material, a second medium layer provided on the first medium layer, a third medium layer provided on the second medium layer, and an electrode provided at an interface between the second and third medium layers. The electrode drives the third medium layer to generate a transverse wave. A propagation speed of the transverse wave in the third medium layer is lower than a propagation speed of the transverse wave in the first medium layer. A propagation speed of the transverse wave in the second medium layer is lower than the propagation speed of the transverse wave in the first medium layer.

This boundary acoustic wave device has a large electro-mechanical coupling coefficient.

REFERENCE NUMERALS

11 Medium Layer (First Medium Layer)
12 Medium Layer (Third Medium Layer)
13 Medium Layer (Second Medium Layer)
14 Electrode
51 Radio-Frequency Circuit
1001 Boundary Acoustic Wave Device
1001A Interface
2001 Electronic Apparatus

DETAILED DESCRIPTION OF PREFERRED EMBODIMENT

Figure 1:
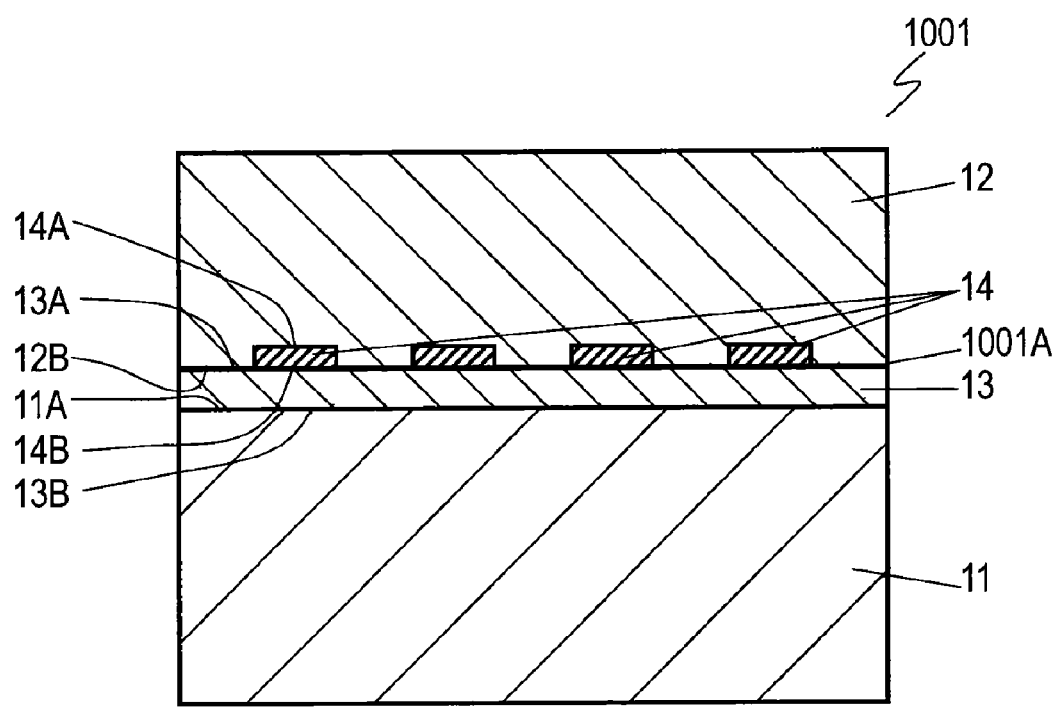
FIG. 1 is a cross sectional view of a boundary acoustic wave device according to an exemplary embodiment of the present invention.

FIG. 1 is a cross sectional view of boundary acoustic wave device 1001 according to an exemplary embodiment of the present invention. Boundary acoustic wave device 1001 includes medium layer 11 made of piezoelectric material, medium layer 13 provided on medium layer 11, electrode 14 provided on medium layer 13, and medium layer 12 provided on medium layer 13 and electrode 14. Medium layer 11 is made of piezoelectric material, such as LiNbO$_3$. Medium layer 12 is made of insulating material, such as SiO2. Electrode 14 is formed at interface 100A between medium layers 12 and 13. Upper surface 11A of medium layer 11 contacts lower surface 13B of medium layer 13. Upper surface 13A of medium layer 13 contacts lower surface 12B of medium layer 12 and lower surface 14B of electrode 14. Upper surface 14A of electrode 14 and upper surface 13A of medium layer 13 contacts lower surface 12B of medium layer 12. Medium layer 13 is formed by doping element, such as Nb, in a surface of a piezoelectric base material constituting medium layer 11. According to the embodiment, electrode 14 is an interdigital transducer (IDT) electrode driving medium layers 11 to 13 to generate an acoustic wave. Main mode of the acoustic wave is a transverse wave. In other words, electrode 14 drives medium layers 11 to 13 to generate the transverse wave propagating in medium layers 11 to 13.

In boundary acoustic wave device 1001, a propagation speed of the acoustic wave (transverse wave) in medium layer 12 is lower than a propagation speed of the acoustic wave (transverse wave) of medium layer 11. A propagation speed of the acoustic wave (transverse wave) in medium layer 13 is lower than the propagation speed of the acoustic wave in medium 11. This structure reduces a difference between the propagation speed of the transverse wave in medium layer 12 provided above upper surface 14A of electrode 14 and each of the propagation speeds of the transverse wave in medium layers 11 and 13 both provided beneath lower surface 14B of electrode 14. This arrangement causes the displacement of medium layers 11 to 13 due to the transverse wave, the main mode of the acoustic wave, to concentrate at the interface between medium layers 12 and 13, hence providing the device with a large electro-mechanical coupling coefficient.

Medium layer 13 is formed by doping element, such as Nb, in the piezoelectric base material constituting medium layer 11. Thus, main component of medium layer 13 is LiNbO$_3$, which is the same as the main component of medium layer 11. Thus, medium layer 11 and 13 has the same piezoelectric characteristics, and thus, having a large electro-mechanical coupling coefficient.

Medium layer 13 is formed by doping Nb in the surface of the base material of the piezoelectric material constituting medium 11, but can be formed by doping element selected from W, Ti, Zn, Mo, Mn, Co, Ni, In, Sn, and rare earth elements in the surface of the base material of the piezoelectric material constituting medium layer 11.

Medium layer 13 can be formed by removing Li atoms from medium layer 11 by proton-exchanging technology, thereby increasing the ratio of Nb in the layer.

Electrode 14 is made of conductive material mainly containing, for example, Au, W, Ta, Cu, Al, or Ag. Electrode 14 mainly containing Au has a large mass density and a small electrical resistance. For an apparatus, such as a duplexer, requiring a high power withstanding capability, electrode 14 can preferably mainly contain Cu.

If the propagation speed of the transverse wave in medium layer 12 is higher than the propagation speed of the transverse wave in medium layer 11, the propagation speed of the transverse wave in medium layer 13 is made higher than the propagation speed of the transverse wave in medium layer 11. This structure reduces the difference between the propagation speed of the transverse wave in medium layer 12 above upper surface 14A of electrode 14 and each of the propagation speeds of the transverse wave in medium layers 11 and 13 beneath lower surface 14B of electrode 14. The propagation speed of the transverse wave in medium layer 13 is between the propagation speed of the transverse in medium layer 11 and the propagation speed of the transverse wave in medium layer 12. This arrangement causes the displacement of medium layer 11 to 13 due to the transverse wave, the main mode of the acoustic wave, to concentrate at the interface between medium layers 12 and 13, hence providing the device with a large electro-mechanical coupling coefficient.

In this particular case, medium layer 11 is made of $LiNbO_3$ and medium layer 12 is made of mixture oxide mainly containing aluminum oxide and silicon oxide. This structure caused the propagation speed of the transverse wave in medium layer 12 to be higher than the propagation speed of the transverse wave in medium layer 11. Medium layer 13 is formed by doping Li in a surface of the piezoelectric base material constituting medium layer 11. This structure causes the propagation speed of the transverse wave in medium layer 13 to be higher than the propagation speed of the transverse wave in medium layer 11.

Medium layer 13 is formed by doping above mentioned element in the piezoelectric base material constituting medium layer 11. The main component of medium layer 13 is $LiNbO_3$, the same as the main component of medium layer 11. Medium layer 11 and 13 has the same piezoelectric characteristics, and hence, provides the device with a large electro-mechanical coupling coefficient.

Figure 2:
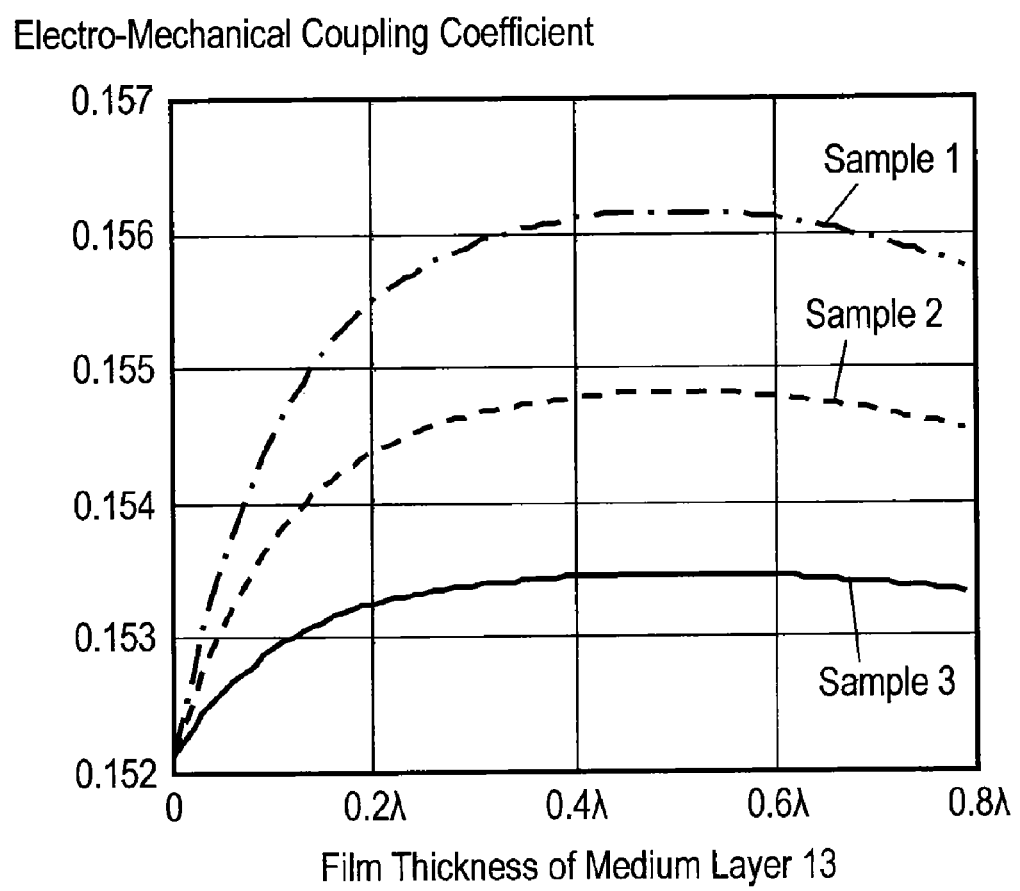
FIG. 2 shows a characteristic of the boundary acoustic wave device according to the embodiment.

Medium layer 11 is not necessarily made of $LiNbO_3$, and may be made of other piezoelectric material, such as $LiTaO_3$, $Li_2B_4O_7$, or quartz crystal by appropriately selecting the doped element and the removed element FIG. 2 shows characteristics of Samples 1 to 3 of boundary acoustic wave device 1001 according to the embodiment, showing electro-mechanical coupling coefficients against the thickness of medium layer 13. Medium layers 11 and 13 were made of a 15°-rotated Y-cut plate of $LiNbO_3$. The transverse wave, the main mode of the boundary acoustic wave, propagating in medium layers 11 to 13 had wave length λ. Medium layer 12 was made of $SiO_2$ having a film thickness of 0.3λ. Electrode 14 was made of Cu having a film thickness of 0.05λ. Samples 1 to 3 of boundary acoustic wave device 1001 were made of the above materials and structure. Samples 1 to 3 were measured in a reduction rate of the propagation speed of the transverse wave in medium layer 13 against the propagation speed of the transverse wave in medium layer 11. The reduction rates of Sample 1, 2 and 3 were measured as 1.5%, 1.0%, and 0.5%, respectively. If medium layer 13 is made by doping 5 mol % of Mg in the base material constituting medium layer 11, the propagation speed of the transverse wave in medium layer 13 against the propagation speed of the transverse wave in medium layer 11 decreases by about 1%.

As shown in FIG. 2, Samples 1 to 3 of boundary acoustic wave device 1001 have a large electro-mechanical coupling coefficient if the film thickness of medium layer 13 is more than 0.2λ and less than 0.8λ. In particular, if the film thickness of medium layer 13 is 0.5λ, the electro-mechanical coupling coefficient of the boundary acoustic wave of device 1001 becomes a maximum.

An other boundary acoustic wave device according to the embodiment including medium layers 11 and 13 mainly containing $LiTaO_3$, has characteristics substantially identical to those of boundary acoustic wave device 1001 including medium layers 11 and 13 mainly containing $LiNbO_3$. In this boundary acoustic wave device, if the ratio of the composition of $Li_2O$ to $Ta_2O_5$ in medium layer 11 is 48.5 to 51.5 and the ration of the composition ratio of $Li_2O$ to $Ta_2O_5$ in medium layer 13 is 47.5 to 52.5, the ration of the propagation speed of the transverse wave in medium layer 13 to the propagation speed of the transverse wave in medium layer 11 decreases by about 1%.

Figure 3:
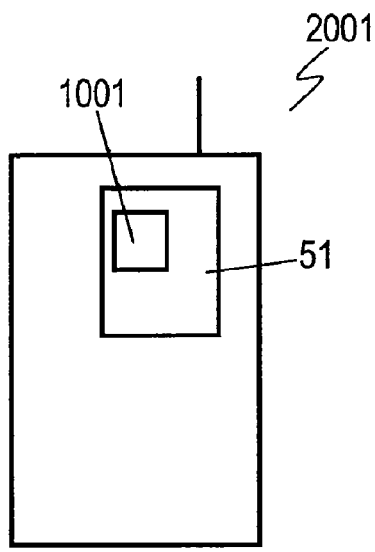
FIG. 3 is a schematic diagram of an electronic apparatus including the boundary acoustic wave device according to the embodiment.
Figure 4:
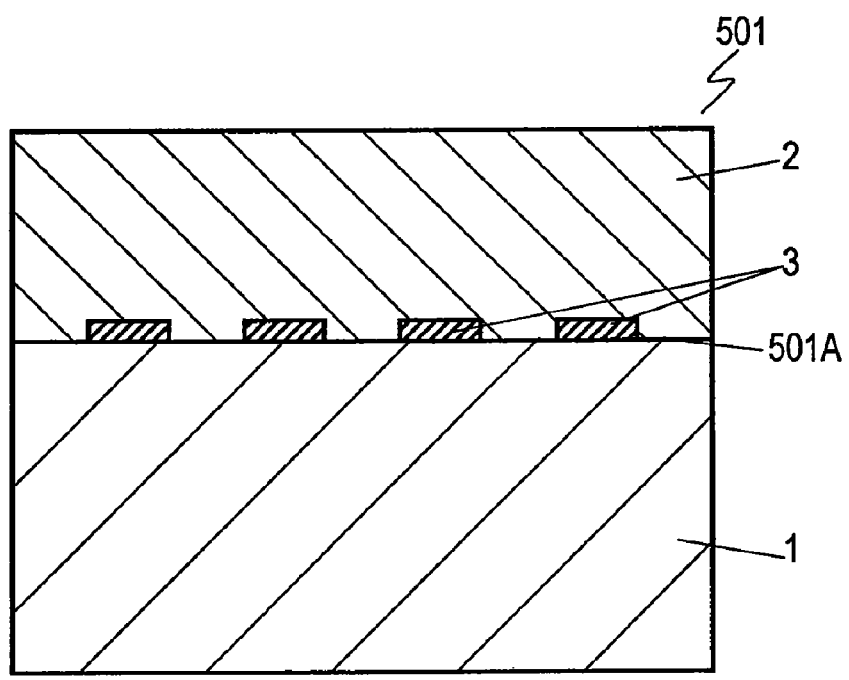
FIG. 4 is a cross sectional view of a conventional boundary acoustic wave device.

FIG. 3 is a schematic diagram of electronic apparatus 2001 including boundary acoustic wave device 1001 according to the embodiment. Electronic apparatus 2001 is a mobile telephone including boundary acoustic wave device 1001 and radio frequency (RF) circuit 51 coupled to boundary acoustic wave device 1001. Boundary wave device 1001 reduces power consumption of electronic apparatus 2001, and increases the receiving sensitivity of the apparatus.

According to the embodiment, terms, such as "upper surface", "lower surface", "above", and "beneath", indicating directions indicates relative directions depending on relative positions of medium layers 11 to 13 and electrode 14, and don't indicate absolute directions, such as a vertical direction.

INDUSTRIAL APPLICABILITY

A boundary acoustic wave device according to the present invention has a large electro-mechanical coupling coefficient, and is useful for various electronic apparatus, such as a mobile telephone.

The invention claimed is:

1. A boundary acoustic wave device comprising:
a first medium layer made of piezoelectric material;
a second medium layer provided on the first medium layer, the second medium layer containing piezoelectric material;
a third medium layer provided on the second medium layer; and
an electrode provided at an interface between the second medium layer and the third medium layer, the electrode driving the third medium layer to generate a transverse wave, wherein
a propagation speed of the transverse wave in the third medium layer is lower than a propagation speed of the transverse wave in the first medium layer,
a propagation speed of the transverse wave in the second medium layer is lower than the propagation speed of the transverse wave in the first medium layer.

2. The boundary acoustic wave device according to claim 1, wherein the first medium layer mainly contains $LiNbO_3$.

3. The boundary acoustic wave device according to claim 2, wherein the third medium layer mainly contains $SiO_2$.

4. The boundary acoustic wave device according to claim 1, wherein main component of the second medium layer is identical to a main component of the first medium layer.

5. A boundary acoustic wave device comprising:
a first medium layer made of piezoelectric material;
a second medium layer provided on the first medium layer, the second medium layer containing piezoelectric material;
a third medium layer provided on the second medium layer; and
an electrode provided at an interface between the second medium layer and the third medium layer, the electrode driving the third medium layer to generate a transverse wave, wherein
a propagation speed of the transverse wave in the third medium layer is higher than a propagation speed of the transverse wave in the first medium layer,
wherein a propagation speed of the transverse wave in the second medium layer is higher than the propagation speed of the transverse wave in the first medium layer.

6. The boundary acoustic wave device according to claim 5, wherein the first medium layer mainly contains $LiNbO_3$.

7. The boundary acoustic wave device according to claim 6, wherein the third medium layer contains mixture oxide mainly containing aluminum oxide and silicon oxide.

8. The boundary acoustic wave device according to claim 5, wherein main component of the second medium layer is identical to main component of the first medium layer.

9. An electronic device comprising:
the boundary acoustic wave device according to claim 1; and
a radio frequency circuit coupled to the boundary acoustic wave device.

10. An electronic device comprising:
the boundary acoustic wave device according to claim 2; and
a radio frequency circuit coupled to the boundary acoustic wave device.

11. An electronic device comprising:
the boundary acoustic wave device according to claim 3; and
a radio frequency circuit coupled to the boundary acoustic wave device.

12. An electronic device comprising:
the boundary acoustic wave device according to claim 4; and
a radio frequency circuit coupled to the boundary acoustic wave device.

13. An electronic device comprising:
the boundary acoustic wave device according to claim 5; and
a radio frequency circuit coupled to the boundary acoustic wave device.

14. An electronic device comprising:
the boundary acoustic wave device according to claim 6; and
a radio frequency circuit coupled to the boundary acoustic wave device.

15. An electronic device comprising:
the boundary acoustic wave device according to claim 7; and
a radio frequency circuit coupled to the boundary acoustic wave device.

16. An electronic device comprising:
the boundary acoustic wave device according to claim 8; and
a radio frequency circuit coupled to the boundary acoustic wave device.

17. The boundary acoustic wave device according to claim 1, wherein the transverse wave has a wavelength $\lambda$, and a thickness of the second medium layer is more than $0.2\lambda$ and less than $0.8\lambda$.

18. The boundary acoustic wave device according to claim 1, wherein a propagation speed of the transverse wave in the second medium layer is between a propagation speed of the transverse wave in the first medium layer and a propagation speed of the transverse wave in the third medium layer.

19. The boundary acoustic wave device according to claim 1, wherein the second medium layer contains an element selected from the group consisting of Nb, W, Ti, Zn, Mo, Mn, Co, Ni, In, Sn, and rare earth elements.

20. A boundary acoustic wave device comprising:
a first medium layer made of piezoelectric material;
a second medium layer provided on the first medium layer;
a third medium layer provided on the second medium layer; and
an electrode provided at an interface between the second medium layer and the third medium layer, the electrode driving the third medium layer to generate a transverse wave, wherein
a propagation speed of the transverse wave in the third medium layer is higher than a propagation speed of the transverse wave in the first medium layer,
wherein a propagation speed of the transverse wave in the second medium layer is higher than the propagation speed of the transverse wave in the first medium layer,
wherein the first medium layer mainly contains $LiNbO_3$, and
wherein the third medium layer contains mixture oxide mainly containing aluminum oxide and silicon oxide.

* * * * *